United States Patent
Koeppl et al.

(10) Patent No.: US 8,067,859 B2
(45) Date of Patent: Nov. 29, 2011

(54) REVERSE POLARITY PROTECTION FOR MOSFETS

(75) Inventors: Benno Koeppl, Mark Indersdorf (DE); Karl-Dieter Hein, Schwindegg (DE); Frank Auer, Roehrmoos (DE)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 12/332,849

(22) Filed: Dec. 11, 2008

(65) Prior Publication Data

US 2010/0148733 A1    Jun. 17, 2010

(51) Int. Cl.
*H01H 35/00* (2006.01)
*H02H 11/00* (2006.01)

(52) U.S. Cl. ......................... 307/127; 361/246

(58) Field of Classification Search ............ 307/127; 361/246
See application file for complete search history.

(56) References Cited

U.S. PATENT DOCUMENTS

| | | | | |
|---|---|---|---|---|
| 5,831,351 | A  * | 11/1998 | Khosrowpour et al. | 307/139 |
| 6,426,857 | B1 * | 7/2002 | Doster et al. | 361/84 |
| 6,922,322 | B2 * | 7/2005 | Strayer et al. | 361/111 |
| 7,250,693 | B2 * | 7/2007 | Hayashi et al. | 307/10.2 |
| 7,418,314 | B2 * | 8/2008 | Rasmussen et al. | 700/286 |
| 2006/0066271 | A1 * | 3/2006 | Yamazaki et al. | 318/140 |

* cited by examiner

*Primary Examiner* — Michael Ruthland Wallis
(74) *Attorney, Agent, or Firm* — Slater & Matsil, L.L.P.

(57) ABSTRACT

The invention relates to a control circuit and a corresponding method for controlling MOSFETs coupled to the control circuit. The MOSFETs are coupled to a load to couple the load to a power supply, or the MOSFETs are coupled to a generator. In case of inverted polarity, the control circuit switches the MOSFETs to their conducting state to prevent damaging the MOSFETs.

23 Claims, 3 Drawing Sheets

REVERSE POLARITY PROTECTION FOR MOSFETS

TECHNICAL FIELD

Embodiments of the invention relate to a control circuit for controlling MOSFETs used as a switch for an electrical load or power source, particularly for MOSFETs used as switches for electro motors or actuators or alternators.

BACKGROUND

MOSFETs and particularly so-called power MOSFETs can be used as switches for coupling an electrical load to a power supply. For example a two-pole load can be coupled to ground by a first MOSFET and to a voltage or current source by a second MOSFET. If both of the MOSFETs are switched to their conducting state, the voltage is applied to the load thus enabling a current flow through the load. In another example the load may have four or more connection terminals for power supply, such that four or more MOSFETs are used to connect the load to a power supply. Each power supply or ground terminal of the load is coupled by one MOSFET to a power supply or ground respectively.

In conventional systems the MOSFETs may be used not only for supplying a load with DC current, but also for supplying a connected load with switched current. For example, in case the load is an AC-motor and the power supply is a direct current (DC) system, for example, a battery, then the MOSFETs can be controlled to provide alternating current as needed.

In this way MOSFETs are used conventionally in vehicles as switches for coupling a load to a power supply, wherein the power supply can be considered a battery. For example, in vehicles a battery and a generator powered by the vehicle's engine are used to supply the electrical system in the vehicle. Accordingly the electrical system is a direct current system and MOSFETs controlled by controller circuits are used as switches, wherein the MOSFETs may be arranged in pairs or in a bridge configuration using four or six or even more MOSFETs. An arrangement of MOSFETs for supplying the load conventionally is controlled by a corresponding control circuit, which may be implemented as an integrated circuit. For controlling the MOSFETs a comparatively small current is needed, such that all elements of a control circuit may be integrated into a single IC. The control circuit in turn may be coupled to another control circuit for receiving signals to switch the load on or off.

Each MOSFET comprises an intrinsic diode. Particularly the most common used N-MOSFETs comprise an intrinsic anti-parallel diode. If for any reason a voltage of inverted polarity is applied to a switched-off N-MOSFET, i.e., when there is no bias voltage applied to the gate of the N-MOSFET, the intrinsic diode will become conductive if the threshold voltage of the intrinsic diode is exceed. The current flowing through the intrinsic diode in connection with the voltage across the diode may result in a non-negligible power consumption, which heats up the MOSFET and may finally destroy the MOSFET. Particularly the intrinsic diode becomes more conductive with increasing temperature, such that a higher temperature builds up a higher current through the intrinsic diode which in turn affects a higher current. As a result one path of a bridge configuration may attract nearly the entire current thus destroying the MOSFETs in this path quickly.

In conventional systems several provisions have been developed to prevent the MOSFETs from being destroyed in case of inverted polarity. In a conventional solution an additional MOSFET is arranged in the power supply line, wherein the MOSFET is arranged such that its intrinsic diode is opposite to that of the MOSFET to protect. The additional MOSFET is switched on in normal operation and prevents a current flow through the MOSFET to protect in case of inverted polarity. In an alternative provision at least one diode is integrated into the power supply line preventing a current flow through the intrinsic diodes of the MOSFETs to protect.

However, a diode in the supply line causes a significant energy loss during normal operation. A solution comprising a MOSFET in a supply line at least needs some circuitry for controlling the MOSFET. Furthermore such a MOSFET, which shall protect power MOSFETs, must be designed as a power MOSFET itself, which makes it costly. Accordingly there is a need for an alternative solution.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated, as they become better understood by reference to the following detailed description.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. For example, electric circuits such as amplifiers may be implemented in various designs. In particular, the following description relates to an embodiment used, for example, in a vehicle, wherein the controller circuit controls a bridge of power MOSFETs for supplying an AC electric motor or actuator. In the past the automotive branch has found that these motors in a lot of applications have advantages over other conventional actuators, for example, as brushless AC motors provide a longer lifetime and may replace hydraulic actuators, such that the use of these motors is widely spread in the automotive branch. However, the invention as described in the following may be also applied to other technical fields, where MOSFETs need to be protected from inverted polarity. The following detailed description, therefore, is not to be taken in a limiting sense, and the scope of the present invention is defined by the appended claims.

Figure 1:
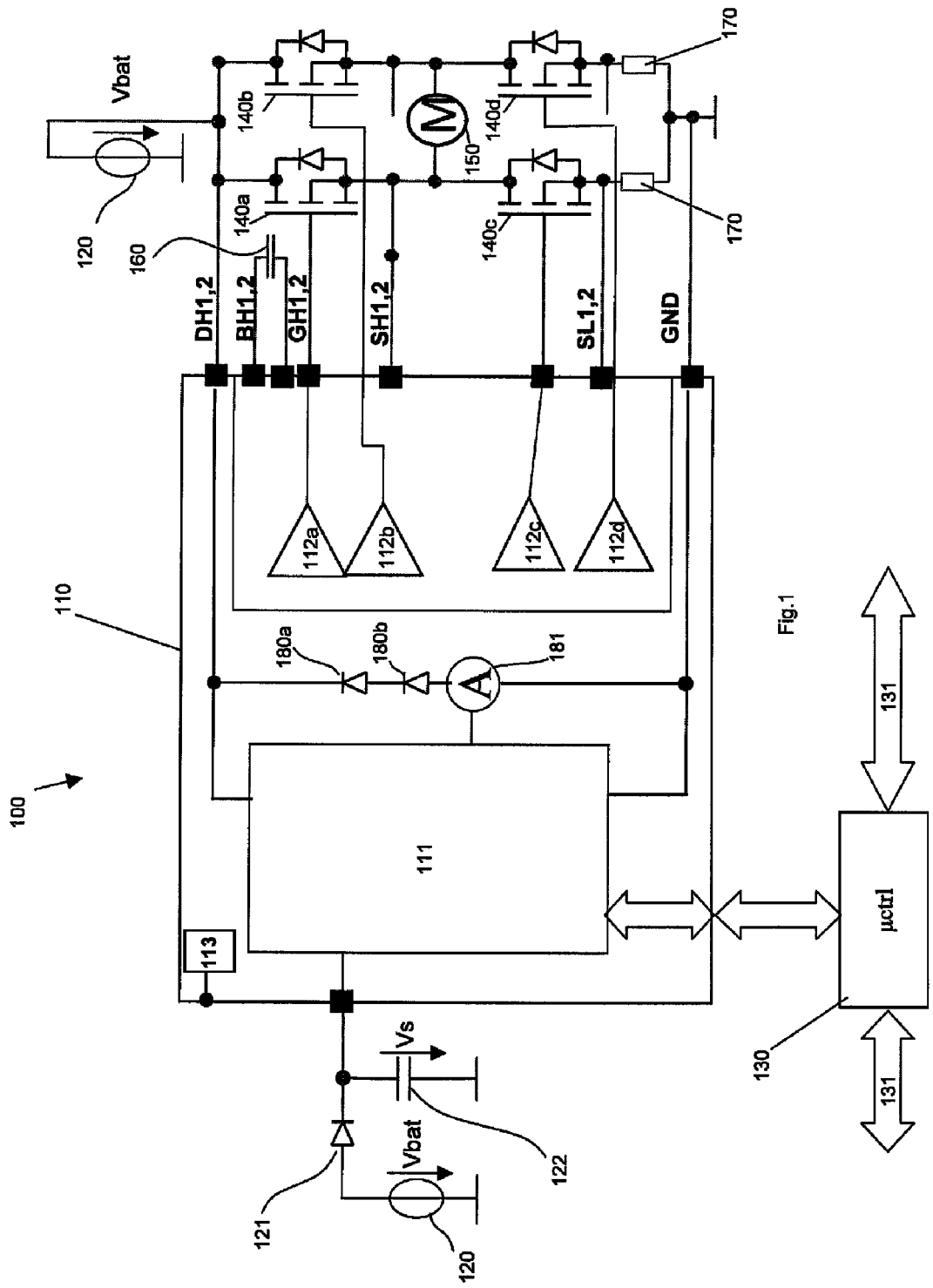
FIG. 1 depicts a schematic controller circuit coupled to MOSFETs in bridge configuration.

FIG. 1 depicts a schematic circuit 100 comprising a control circuit 110 coupled to a power supply 120. The power supply in this embodiment is a battery, which is typical for applications in the automotive branch. Circuit 110 is coupled via diode 121 and capacitor 122 to the battery voltage $V_{bat}$, wherein the diode and the capacitor serve as a filter to provide a stable supply voltage $V_S$ to circuit 110.

Also control circuit 110 may be communicatively coupled, for example, to a microcontroller 130 (μctrl). Microcontroller 130 in turn may be communicatively coupled to a bus system 131, the microcontroller thus being a bus node. Microcontroller 130 may, for example, receive information via bus system 131 on how to control load 150, which the microcontroller forwards to controller circuit 110, i.e., in particular to control block 111. Control circuit 110 in turn may pass information to the microcontroller, for example, for reporting errors via bus system 131 to a central control unit of the vehicle. Microcontroller 130 may be a conventional controller coupled to a conventional bus system such as, for example, the CAN bus protocol or 12C or LIN system.

In this embodiment load 150 may be a DC electric motor. Accordingly the power supply, i.e., the battery voltage, may be supplied directly to the motor, wherein the voltage may be coupled to different terminals at the motor for enabling different rotating directions. The power is provided by four MOSFETs 140a-140d (collectively 140) which are in bridge configuration and which are controlled by controller circuit 110. That is the control terminals of the MOSFETS, i.e., the gate terminals, are coupled to controller circuit 110, which switches the MOSFETs on or off for coupling the terminals of load 150 to battery voltage $V_{bat}$ or ground, i.e., reference potential respectively. Providing power to the different terminals of the load is achieved by opening and closing the MOSFETs accordingly, i.e., by opening MOSFETs 140a and 140c at the same time while closing MOSFETs 140b and 140d or vice versa. Note that embodiments of the invention may be applied analogously to circuits using fewer or more MOSFETs, for example, six or twelve MOSFETs in bridge configuration for supplying 3-phase motors or other actuators.

Control circuit 110 comprises a control block 111 and output drivers 112a to 112d, wherein one output stage is coupled to one gate terminal of a MOSFET 140. Control block 111 is coupled to the power supply terminals of circuit 110 as well as to microcontroller 130 for receiving and transmitting control information. Furthermore control block 111 is coupled to the output drivers 112a to 112d for controlling which of the MOSFETs 140a-140d to close or open.

Besides the functionality to receive information from and transmitting information to the microcontroller, controller block 111 is configured and adapted to provide further functionality as known from conventional control circuits. In one embodiment, block 111 may incorporate a charge pump for charging bootstrap capacitor 160, logic for providing shoot through protection or short circuit protection. Besides these features block 111 is adapted and configured to detect situations of inverted polarity and to react accordingly as described in further detail below.

In normal operation control circuit 110 in a first step checks the polarity of the supply voltage in order to detect an inverted polarity. If the check reveals that supply conditions are normal, then control block 111 may check for low voltage conditions and, if there are normal voltage conditions, continue with normal operation. That is, control block 111 controls drivers 112a to 112d, which in turn control MOSFETs 140a to 140d to supply load 150, i.e., in this embodiment the DC motor, with current, as instructed, for example, by microcontroller 130. That is control circuit 110 in a first operation step checks for inverted polarity and, if the check reveals normal operating conditions, continues with normal operation.

Inverted supply polarity detection, for example, can be achieved in a plurality of ways by control block 111. In one embodiment only the voltage of the highside drain is compared to ground (GND), i.e., the reference potential. A situation of inverted supply polarity is indicated if the voltage of the drain terminals of the highside MOSFETs 140a, 140b, i.e., the voltage of terminals DH1, 2, is below ground.

In an alternative embodiment the voltages of the source terminals of highside MOSFETs 140a or 140b is compared to the reference potential and the polarity of the voltages of the highside MOSFETs is considered. Here a situation of inverted supply polarity is indicated if the voltage of the source terminals of the highside MOSFETs is below reference potential and the voltage at the source terminals of the highside MOSFETs is below the voltage at the source terminals of the highside MOSFETs.

In still another embodiment the voltages of the source and drain terminals of highside MOSFETs 140a and 140b are considered. A situation of inverted supply polarity is detected if both the voltages of the source terminals and the drain terminals of highside MOSFETs 140a or 140b are below ground potential.

Note that inverted polarity may be caused by accidentally swapping the terminals of a battery of a vehicle. This, for example, may happen particularly in winter time when a weak battery of a vehicle breaks down and the vehicle gets a jump start by coupling the weak battery to the battery terminals of another vehicle, wherein the terminals are coupled incorrectly. This situation affects an undefined supply voltage roughly somewhere between −4V and +4V, depending on the residual strengths of the weak battery and the electrical strength of the coupled system. In any case the coupled system will not provide a supply voltage sufficient for normal operation or operation under reduced voltage. Moreover it is likely that a voltage of inverted polarity is coupled to the terminals of control circuit 110 and to the terminals of the MOSFETs 140.

Once a situation of inverted supply polarity is detected, control block 111 protects MOSFETs 140a-140d from being destroyed. To prevent a current flow through the intrinsic diodes of the MOSFETs 140a to 140d, control circuit 110 immediately applies a suitable gate voltage to all of the coupled MOSFETs switching them to their conducting state. That is both the high-side MOSFETs 140a and 140b and the low-side MOSFETs 140c and 140d are conducting at the same time, thus enabling a so-called shoot-through and effectively short-circuiting power supply 120 to ground level. Accordingly in this situation of inverted voltage a current will flow through each MOSFET 140 from source to drain, i.e., in the "wrong" direction. Switching the MOSFETs to their conducting state in this situation of inverted polarity affects that there will be only a negligible current flow through the intrinsic diodes of the MOSFETs, but a strong current will flow through the conducting channels of the MOSFETs. This in turn effects that there is a small power loss in each of the MOSFETs, as there is only a small voltage drop across the conducting channel of a MOSFET. Due to the small power loss each MOSFET will heat up only to a small degree, which will not destroy a MOSFET. Also, as the conductance of a MOSFET decreases with increasing temperature, the current will apportion equally across parallel MOSFETs, thus heating the MOSFETs equally. In this way control circuit 110 opens all coupled MOSFETs if a situation of inverted supply polarity is detected, thus preventing a massive current flow across the intrinsic diode of each MOSFET 140.

Another effect of switching all MOSFETs 140 to their conducting state is a significant reduction of the voltage amplitude provided by the power supply. By effectively short-circuiting the power supply, the voltage of the power supply is reduced to that across the conducting MOSFETs, which, depending on the particular properties of the deployed MOSFETs, results in a residual voltage of −1V to −2V instead of the full voltage of the inverted power supply. In this way circuit 100 may serve as central inverse-polarity protection for other circuits coupled to the power supply.

Optionally the MOSFETs may be switched to their conducting state only in a situation of inverted supply polarity and if the current through the MOSFETs, due to the inverted polarity the current flows from drain to source and through the intrinsic diodes in each MOSFET, exceeds a predefined threshold amplitude. Switching the MOSFETs to their conducting state only when the current through the intrinsic diodes exceeds the predefined threshold amplitude may prevent shoot-through situations during normal operation of the MOSFETs. For example, if during normal operation control block 111 detects a situation of inverted supply polarity for whatever reason, but wherein the resulting current through the intrinsic diodes of a MOSFET does not damage the MOSFET, then the small current may be tolerated.

For evaluating whether a current through a MOSFET exceeds a predefined threshold, amplitude circuit 100 may comprise measuring means for determining the current amplitude. In one embodiment the measuring means may be implemented by conventional measuring means 170 directly sensing the current through a line coupled to a source or drain terminal of a MOSFET. The means, for example, may comprise a shunt as depicted in the figure providing a voltage signal to control block 111.

In an alternative embodiment the means for determining the amplitude of a current through the MOSFETs may be comprised in control circuit 110, i.e., the means may be comprised in the integrated circuit implementing control circuit 110. Control circuit 110 accordingly comprises two diodes 180a, 180b connected in series between the ground terminal, i.e., GND in the figure, and the voltage in question, that is the voltage coupled to the drain of highside MOSFETs 140a and 140b respectively. Diodes 180a, 180b are replicas of the intrinsic diodes of MOSFETs 140 and are switched in parallel to these diodes, such that they behave as close as possible like the intrinsic diodes. So in case of inverted polarity the current through replica diodes 180a, 180b will reflect the current through the MOSFETs. Furthermore circuit 110 may comprise a current sensor 181 providing a signal reporting the amplitude of a current through the replica diodes to control block 111. In this way control block 111 may evaluate a signal reflecting the current through the intrinsic diodes of the MOSFETs without including a current sensor in a path to or from a MOSFET. Note that embodiments described below may be similarly configured and adapted for sensing and processing the amplitude of a current in case of an inverted polarity situation.

In case the situation of inverted polarity at the supply terminals of control circuit 110 is detected, circuit 110 uses internal energy storages for supplying itself with energy in order to perform the step of switching the coupled MOSFETs to their conducting state. At the same time, i.e., as soon as the situation is detected, circuit 110 enters an energy saving operating mode in order to apply the control, i.e., gate, voltages to the MOSFETs for as long as possible to allow a current flow through the MOSFETs as long as possible. Ideally the current flow through the MOSFETs in this way is enabled as long as the situation of inverted supply voltage lasts.

In one embodiment control circuit 110 may use existing energy storages for supplying itself with electrical energy. These existing energy storages may be those, which are dedicated for operating the control circuit and the MOSFETs under normal operating conditions, and which are somewhat misused in case of an inverted supply polarity. In one embodiment control circuit 110 uses capacitor 122 for energy supply.

Diode 121 prevents capacitor 122 from being discharged in case the supply voltage drops below the actual voltage across the capacitor, such that the diode also prevents the capacitor from being discharged in case of inverted supply polarity. In an alternative embodiment diode 122 may be replaced by a switch, for example, a MOSFET operated by control circuit 110, wherein the switch is set to conducting in normal operation and to non-conducting otherwise in order to prevent discharging of capacitor 122. Capacitor 122 may be furthermore adapted in its capacity to provide sufficient energy for supplying control circuit 110 for at least some seconds.

Alternatively or in addition to using capacitor 122 as an energy supply, control circuit 110 may use the bootstrap capacitor 160 for supplying itself with energy. For that purpose control circuit 110 is adapted and configured to prevent the capacitor 160 from discharging while control circuit 110 is switched off or in case a situation of inverted is detected. In one example this can be achieved in that the capacitor is coupled to the source terminal of the highside-MOSFETs only in normal operating conditions, i.e., in case of non-inverted voltage supply.

Control circuit 110 may be further adapted to ensure that capacitor 122 and/or bootstrap capacitor 160 retain their charge while control circuit 110 is not operating. That is, control circuit comprises circuitry for buffering the charge of the capacitors, while the control circuit is not actively operated, for example, while the vehicle is switched off, circuit 110 thus being in a sleep mode. More generally speaking control circuit 110 may be adapted and configured to buffer existing energy storages with energy while the circuit does not control the MOSFETs, such that these energy storages can be used in case of an inverted supply polarity.

In an alternative embodiment, circuit 100 may comprise a small battery as emergency-power supply 113, for example, a button cell, comprised in and coupled to the circuit. Note that a similar battery backup may be comprised in the embodiments described below.

Furthermore control circuit 110 may enter an energy saving mode in case an inverted supply polarity is detected, such that the energy storage used for operating the control circuit enables the opening of the MOSFETs as long as possible. In one embodiment the controller may abandon to issue an error signal or message to a coupled microcontroller 130, which in this situation most probably will be unable to operate correctly and process the message.

An operating method of the control circuit, which at least controls one MOSFET, accordingly comprises the step of controlling the MOSFET to switch to its conducting state in case of an inverted power supply, wherein the control circuit is supplied by an energy storage originally dedicated to operation in case of a non-inverted supply polarity. The control circuit, for example, may check for an inverted supply polarity situation when the circuit is powered up. Energy storages may be a smoothing capacitor in the supply line of the control circuit and/or a bootstrap capacitor.

Control circuit 110 accordingly is adapted and configured to control at least one MOSFET to switch to a conducting state in case of an inverted supply polarity, wherein the control circuit is supplied by an energy storage means originally dedicated to operation in case of a non-inverted supply polarity.

Figure 2:
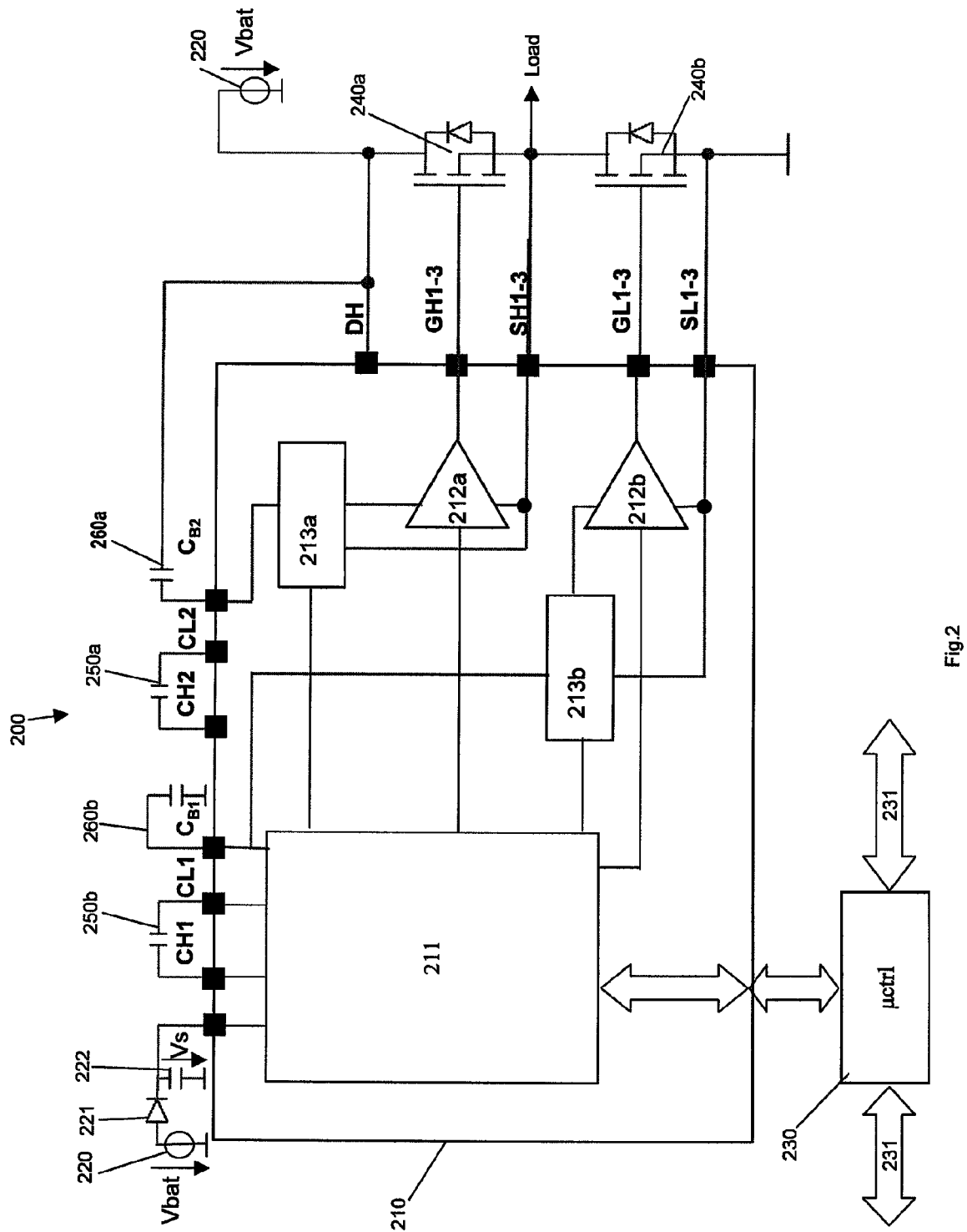
FIG. 2 depicts a schematic circuit of an alternative control circuit.

FIG. 2 depicts another embodiment 200 of a control circuit 210 for controlling MOSFET transistors 240a and 240b, wherein the MOSFETs may couple a load to an energy source. Similar as described above, control circuit 210 is coupled to a voltage supply 220, which in this embodiment may be the battery of a vehicle and which also is coupled to the high-side MOSFET 240*a* for supplying the load. Note that in this embodiment control circuit 210 may control two MOSFETs as depicted or a plurality of MOSFETs in pairs, wherein each pair comprises a high-side MOSFET, i.e., similar to MOSFET 240*a*, coupled between power supply 210 and the load and a low-side MOSFET, i.e., similar to MOSFET 240*b*, coupled between the load and reference ground. For example, control circuit 210 may control only one pair of MOSFETs, i.e., as illustrated by MOSFET 240*a* and 240*b*, for supplying a simple load requiring unidirectional direct current, or the load may be a motor requiring three half-bridges of MOSFETs for supplying three phases of current. Furthermore control circuit 210 may be communicatively coupled to a microcontroller 230, which in turn may be coupled to a conventional bus system 231, from which the microcontroller 230 and consecutively control circuit 210 receive control information specifying how to control the load in normal operation.

The power supply path of control circuit 210 may comprise a diode 221 and a smoothing capacitor 222 for filtering and smoothing the supply voltage provided to circuit 210.

Controller circuit 210 comprises control block 211, MOSFET driver circuits 212*a* and 212*b* (collectively 212) and voltage stabilizers 213*a* and 213*b* (collectively 213). Besides being coupled to the voltage supply, control block 211 is coupled to microcontroller 230 and to the voltage stabilizers and driver circuits for controlling these and thus the MOSFETs.

Controller circuit 210 differs from that illustrated in FIG. 1 in the way voltages for controlling the MOSFETs. Each MOSFET is driven by an individual driver circuit 212*a* and 212*b* respectively, which in turn is powered by a voltage stabilizer 213*a* and 213*b* respectively. The voltage stabilizers 213*a*, 213*b* and the driver circuits 212*a*, 212*b* are each controlled by control block 211.

For driving high-side MOSFET 240*a*, i.e., MOSFETs coupled to a supply voltage with one terminal, the circuit provides a charge pump using pump capacitor 250*a* and buffer capacitor 260*a*. In normal operation pump capacitor 250*a* is controlled to charge buffer capacitor 260*a*, such that the voltage of capacitor 260*a* can be added to the supply voltage for driving driver circuit 212*a*, such that the driver circuit is capable of a voltage high enough to open high-side MOSFET 240*a*. Note that voltage stabilizer 213*a* is optional to provide a more controlled voltage. That is, for providing a control voltage for controlling a high-side MOSFET, this embodiment uses a charge pump for charging buffer capacitor 260*a*.

Similarly control circuit 210 provides another charge pump using pump capacitor 250*b* and buffer capacitor 260*b* for providing a control voltage to low-side driver 212*b*. Note that the output of buffer capacitor 260*b* may be controlled/stabilized by optional voltage stabilizer 213*b*.

Control block 211 in control circuit 210 comprises means for detecting an inverted polarity at the power supply terminals, which may be similar as described above. Also similar as described above in case a situation of inverted polarity is detected, control block 211 controls all MOSFET driver circuits 212 to switch the coupled MOSFETs to their conducting state, thus preventing a current flow through the intrinsic diodes of the MOSFETs, such that the MOSFETs are protected.

The power supply for supplying control block 211 and also for supplying voltage stabilizers 213 and for switching the MOSFETs 212 to their conducting state may be provided by smoothing capacitor 222 and by buffer capacitors 260*a* and 260*b*. Note that the in case where more half-bridges of MOSFETs are arranged in circuit 200 the circuit comprises more buffer capacitors, namely one buffer capacitor for each of the coupled MOSFETs. In one embodiment smoothing capacitor 222 may supply control block 211 and buffer capacitors 260*a*, 260*b* may supply power to the voltage stabilizers 213*a*, 213*b* and thus to operate driver circuits 212*a*, 212*b* to switch the coupled MOSFETs to conducting. However, in case the voltage or charge of any of the buffer capacitors 260*a* or 260*b* is too low to provide sufficient operating voltage, control block 211 may use a charge pump supplied by smoothing capacitor 222 to charge the capacitor for enabling the switching of the MOSFETs. That is control block 211 may comprise a charge pump for charging any buffer capacitor from the smoothing capacitor, or it may control the appropriate charge pump dedicated to charge the capacitor correspondingly, wherein the smoothing capacitor is used for supplying the charging operation.

Control block 211 may furthermore enter an energy saving operating mode in order to use the energy provided by the smoothing capacitor and the buffer capacitors more effectively. That is the control block may not issue a message or signal to microcontroller 230 indicating the detected situation of inverted supply polarity.

In order to enable control circuit 210 to detect a situation of inverted polarity and then to react correspondingly, the depicted arrangement is adapted and configured to buffer smoothing capacitor 222 and buffer capacitors 260*a* and 260*b*, such that they can be used as power supplies when needed. That is control circuit 210 is coupled to power supply even if the coupled MOSFETs are not operated, for example, when the vehicle is switched off.

In still another embodiment a control circuit of the above described type comprising at least one half-bridge of MOSFETs is used for rectifying the output of a generator, wherein the two or three or even more half-bridges of MOSFETs may be used. Rectifiers comprising controlled MOSFETs are favorable in rectifiers as they have smaller losses in their conducting state. However, the MOSFETs must be controlled to switch between conducting and non-conducting respectively according to the output of a coupled generator. Particularly in the automotive branch, i.e., in vehicles, rectifiers comprising MOSFETs are advantageous as they help to save energy, i.e., to reduce the fuel consumption of a vehicle. However the MOSFETs are very sensitive to inverted polarity when switched off, as it takes only fractions of a second to destroy a rectifier comprising power MOSFETs. Accordingly the MOSFETs in the rectifier have to be protected from inverted polarity.

Figure 3:
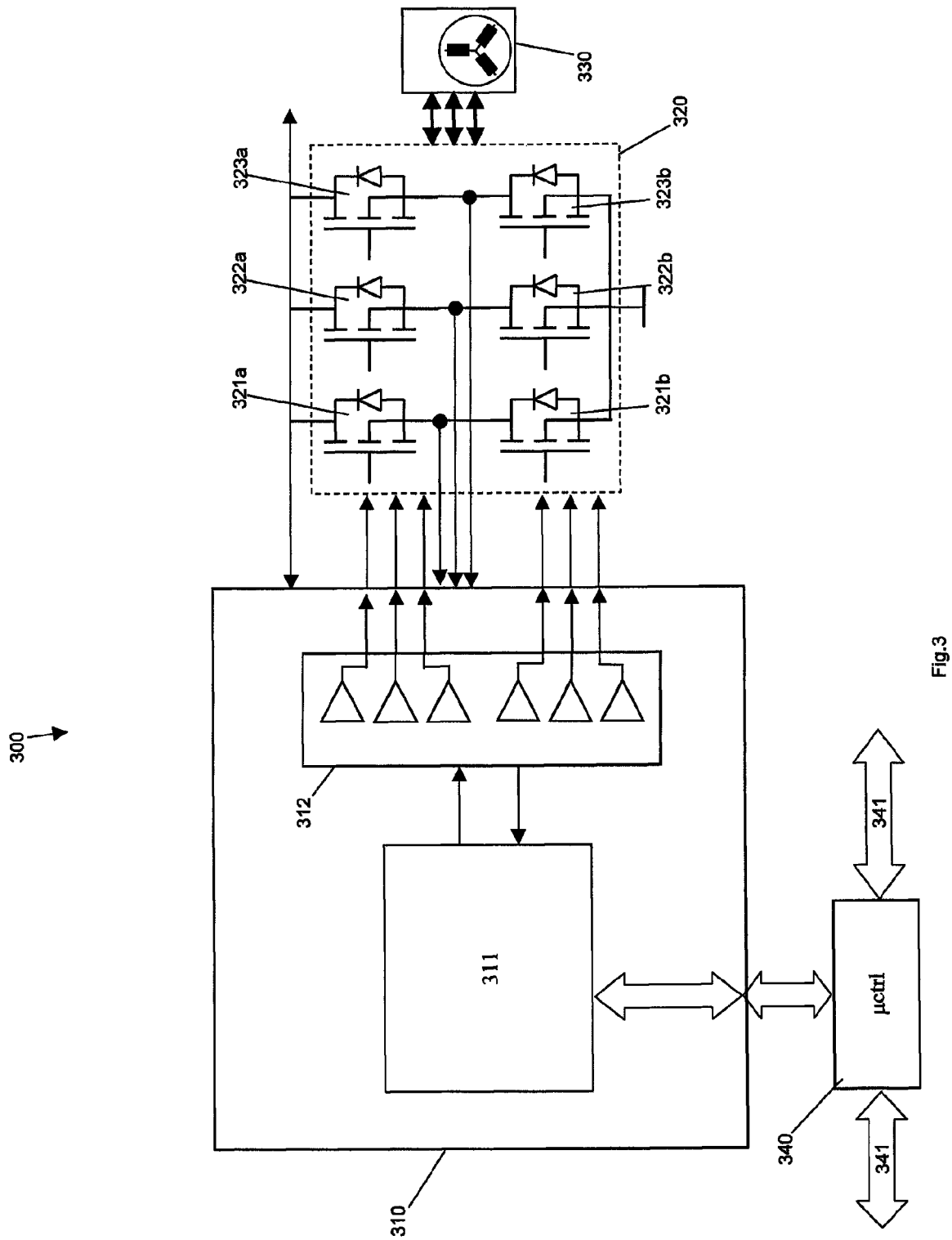
FIG. 3 depicts a schematic circuit of circuit controlling a rectifier coupled to an alternator.

FIG. 3 depicts a schematic embodiment 300 of a control circuit 310 for controlling a rectifier 320 for coupling the output of an alternator 330 to the electrical system of, for example, a vehicle. Control circuit 310 is furthermore coupled to microcontroller 340, which in turn is coupled to a bus system 341, for example, for receiving control messages from another electric control unit instructing microcontroller 340 how to operate control circuit 3 10.

Control circuit 310 comprises a control block 311 and MOSFET drivers 312. Control block 311 is adapted and configured to communicate with microcontroller 340 and to control MOSFET drivers 312. MOSFET drivers 312 in turn are coupled to power MOSFETs external to control circuit 310.

Rectifier 320 in this embodiment comprises three half-bridges of MOSFETs, each half-bridge comprising a high-side MOSFET and a low-side MOSFET. Note that alternative embodiments may comprise more or less half-bridges of MOSFETs, wherein the number of half-bridges is related to the specific design of the coupled alternator 330.

Alternator 330 may be mechanically coupled to the combustion engine of the vehicle, such that the alternator may generate electrical energy when running the combustion engine. As the alternator produces alternating current and the electrical system of a conventional vehicle is a direct current system, the output of alternator 330 must be rectified before being coupled to the electrical system. As the output of the alternator should be converted to direct current preferably as efficiently as possible the rectifier comprises power MOSFETs, which must be controlled, such that they couple a phase of the alternator according to its actual voltage to the electrical system. This control is provided by control circuit 310 using driver circuits 312 for driving the power MOSFETs in rectifier 320.

Rectifier 320 comprises three half-bridges 321, 322 and 323 of MOSFETs, each half-bridge comprising a high-side MOSFET, i.e. MOSFETS 321a and 322a and 323a respectively, and a low-side MOSFET, i.e., MOSFETs 321b, 322b and 323b respectively. Each of the MOSFETs is coupled to and driven by a driver 312. The MOSFET half-bridges are coupled to the phases of alternator 330 to couple its phase to the electrical system.

Although not depicted in the drawing, control circuit 310 is coupled to external elements for power supply, i.e., for example, a diode and a smoothing capacitor as shown in FIGS. 1 and 2. Also control circuit 310 either uses a bootstrap capacitor analogously to that depicted in FIG. 1 or at least one charge pump arrangement comprising a buffer capacitor for enabling the high-side MOSFET drivers 312 to provide a suitable control voltage to the gate terminals of the coupled high-side MOSFETs 321a to 323a.

When the electrical system of the vehicle is operated, i.e., for example, when the combustion engine is started to move the vehicle, control circuit 310 permanently checks if alternator 330 provides a voltage of inverted polarity to rectifier 320.

The check for inverted polarity can be performed, for example, by checking the polarity of the voltages provided by the alternator to the rectifier. If control circuit 310 senses that alternator 330 provides inverted voltages to the rectifier, then control block 311 acts similar as described above for control blocks. That is control block 311 immediately controls drivers 312 to switch the coupled MOSFETs in rectifier 320 to their conducting state for protection and enters an energy saving operating mode. Once the MOSFETs are switched to their conducting state, the voltage and current produced by the alternator is coupled to the battery, such that most likely the power supply of the electric system and also of the control circuit will break down. Accordingly in case the alternator produces voltage of inverted polarity there will be no power supply for control circuit 310. For that reason control circuit 310 at least one of the coupled energy storages as mentioned above, while controlling the drivers to open the MOSFETs. Accordingly the control circuit may use a smoothing capacitor comprised in the voltage supply line or bootstrap capacitor or charge pump buffer capacitor or a combination of these for supply. Furthermore control block 311 may also comprise a charge pump for charging a capacitor in order to provide a gate voltage sufficiently high for controlling the high-side MOSFETs to switch to conducting.

Control circuit 310 may be furthermore adapted and configured to buffer the coupled energy storages with electrical energy while controller circuit is not actively instructed to operate the rectifier in normal operation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a control circuit and at least one MOSFET, the control circuit controlling the MOSFET and coupled between a load and an energy source, the method comprising:
supplying the control circuit with a non-inverted supply polarity from an energy storage device; and
causing the MOSFET to switch to a conducting state upon detection that an inverted supply polarity from the energy storage device is being applied to the control circuit, wherein the MOSFET is switched to its conducting state upon detection of the inverted supply polarity only if a current amplitude through the MOSFET exceeds a predefined threshold value.

2. The method of claim 1, wherein the energy storage device comprises a smoothing capacitor or a bootstrap capacitor or a buffer capacitor related to a charge pump.

3. The method of claim 1, wherein the control circuit comprises a battery as an emergency power supply in case of detection of the inverted supply polarity.

4. The method of claim 1, wherein the control circuit buffers the energy storage device while not controlling the MOSFET.

5. The method of claim 1, wherein the control circuit enters an energy saving status after the inverted supply polarity is detected.

6. The method of claim 1, further comprising charging a bootstrap capacitor when the inverted supply polarity is detected.

7. The method of claim 1, wherein the at least one MOSFET comprises a plurality of MOSFETs, the control circuit controlling a rectifier that comprises the plurality of MOSFETs.

8. The method of claim 7, wherein the control circuit causes each of the MOSFETs to switch to their conducting state upon detection of the inverted supply polarity.

9. The method of claim 7, wherein each of the MOSFETs is switched to their conducting state upon detection of the inverted supply polarity only if a current amplitude through one of the MOSFETs exceeds a predefined threshold value.

10. A method for operating a control circuit controlling a rectifier that comprises MOSFETs, the method comprising causing the MOSFETs to switch to their conducting state when the rectifier is coupled to an inverted supply polarity, wherein the control circuit is supplied by an energy storage device designed for operation with a non-inverted polarity, wherein the MOSFETs are switched to their conducting state upon detection of the inverted supply polarity only if a current amplitude through the MOSFETs exceed a predefined threshold value.

11. A controller circuit for controlling a MOSFET, the controller circuit adapted and configured to control the MOSFET to switch to a conducting state upon detection of an inverted supply polarity, wherein the control circuit is supplied by an energy storage device originally designed for operation with a non-inverted supply polarity, wherein the MOSFET is switched to its conducting state upon detection of the inverted supply polarity only if a current amplitude through the MOSFET exceeds a predefined threshold value.

12. The controller circuit of claim 11, further comprising a detector coupled with a current path of the MOSFET to determine the current amplitude through the MOSFET in case of the inverted supply polarity.

13. The controller circuit of claim 11, wherein the energy storage device comprises a smoothing capacitor or a bootstrap capacitor or a buffer capacitor related to a charge pump.

14. The controller circuit of claim 11, wherein the controller circuit comprises a buffering circuit to buffer the energy storage device while not controlling the MOSFET.

15. The controller circuit of claim 11, further comprising a battery that serves as an emergency power supply in case of the inverted supply polarity.

16. The controller circuit of claim 11, wherein the controller circuit is adapted and configured to enter an energy saving status when detecting the inverted supply polarity.

17. A controller circuit comprising:
a power supply input to be coupled to a power source;
a control input;
first and second outputs, each output to be coupled to a control terminal of a switch that couples a load to an energy source; and
a control circuit coupled to the power supply input and the control input to generate first and second control signals at the first and second outputs respectively, wherein:
the first and second control signals cause the switch to couple the load to the energy source in a normal operation mode when a signal received at the control input indicates that the load is to receive power and when the power source provides a normal supply potential to the power supply input;
the first and second control signals cause the switch to decouple the load from the energy source when the signal received at the control input indicates that the load is not to receive power; and
the first and second control signals cause the switch to conduct in a switch protection mode when the power source provides an inverted supply potential to the power supply input, the inverted supply potential having an opposite polarity than the normal supply potential, and only when an amplitude of a current through the switch exceeds a limit.

18. The controller circuit of claim 17, wherein the first and second control signals cause the switch to conduct in a switch protection mode when the power source provides an inverted supply potential to the power supply input regardless of a state of the signal received at the control input.

19. The controller circuit of claim 17, wherein the power source generates a voltage from the energy source.

20. The controller circuit of claim 19, wherein the power source comprises a capacitor coupled to the energy source.

21. The controller circuit of claim 17, wherein the switch includes a first MOSFET with a gate to be coupled to the first output and a second MOSFET with a gate to be coupled to the second output, wherein:
the first and second control signals cause the first and second MOSFET to switch between an on-state and an off-state such that one MOSFET is in the on-state and the other MOSFET is in the off-state at a time during the normal operation mode;
the first and second control signals cause both the first and second MOSFETs into the off-state when the signal received at the control input indicates that the load is not to receive power and the power source provides the normal supply potential to the power supply input; and
the first and second control signals cause both the first and second MOSFETs into the on-state when the power source provides the inverted supply potential to the power supply input.

22. The controller circuit of claim 21, further comprising a third output to be coupled to a gate of a third MOSFET and a fourth output to be coupled to a gate of a fourth MOSFET, wherein the control circuit causes the third MOSFET to be in the on-state when the first MOSFET is in the on-state and the fourth MOSFET to be in the on-state when the second MOSFET is in the on-state.

23. A system comprising:
a transistor; and
a controller adapted to check a polarity of a supply voltage to detect an inverted polarity, and to control the transistor to switch to a conducting state upon detection of the inverted polarity, wherein the transistor is switched to the conducting state upon detection of the inverted polarity only if a current amplitude through the transistor exceeds a predefined threshold value.

* * * * *

UNITED STATES PATENT AND TRADEMARK OFFICE
CERTIFICATE OF CORRECTION

PATENT NO. : 8,067,859 B2  
APPLICATION NO. : 12/332849  
DATED : November 29, 2011  
INVENTOR(S) : Benno Koeppl Page 1 of 1

It is certified that error appears in the above-identified patent and that said Letters Patent is hereby corrected as shown below:

On the Title Page, Item (75) Inventors, delete "Mark" and insert --Markt--.

Signed and Sealed this
Twenty-ninth Day of April, 2014

Michelle K. Lee
*Deputy Director of the United States Patent and Trademark Office*